(12) United States Patent
Shin et al.

(10) Patent No.: US 12,713,820 B2
(45) Date of Patent: Aug. 18, 2026

(54) ORGANIC LIGHT EMITTING DISPLAY DEVICE CAPABLE OF PREVENTING LIFT-OFF DEFECTS

(71) Applicant: LG Display Co., Ltd., Seoul (KR)

(72) Inventors: Youngsub Shin, Goyang-si (KR); Mikyung Lee, Goyang-si (KR); Chaekyung Lim, Seoul (KR); Seungbum Lee, Gimpo-si (KR); Kyungwhon Min, Seoul (KR)

(73) Assignee: LG Display Co., Ltd., Seoul (KR)

( * ) Notice: Subject to any disclaimer, the term of this patent is extended or adjusted under 35 U.S.C. 154(b) by 363 days.

(21) Appl. No.: 18/489,286

(22) Filed: Oct. 18, 2023

(65) Prior Publication Data

US 2024/0147822 A1 May 2, 2024

(30) Foreign Application Priority Data

Oct. 26, 2022 (KR) ........................ 10-2022-0139511

(51) Int. Cl.
*H10K 59/80* (2023.01)
*H10K 59/122* (2023.01)
*H10K 59/40* (2023.01)

(52) U.S. Cl.
CPC ....... *H10K 59/8792* (2023.02); *H10K 59/122* (2023.02); *H10K 59/40* (2023.02); *H10K 59/873* (2023.02)

(58) Field of Classification Search
CPC .. H10K 59/8792; H10K 59/122; H10K 59/40; H10K 59/873; H10K 50/865; H10K 59/38; H10K 59/12; H10K 50/81; H10K 50/8426; H10K 50/844; H10K 59/123
See application file for complete search history.

(56) References Cited

U.S. PATENT DOCUMENTS 8,963,138 B2 * 2/2015 Lim ..................... H10K 59/879 313/506
9,105,875 B2 * 8/2015 Kim ..................... H10K 59/879
9,547,167 B1 * 1/2017 Sakai ................... G02B 26/005
10,896,939 B2 * 1/2021 Jeon ................... H10K 59/8731
2011/0220924 A1 * 9/2011 Fukuda ............. H10K 59/8792 257/91
2012/0168796 A1 7/2012 Moon et al.
2015/0340414 A1 * 11/2015 Choi ..................... H10K 59/35 438/34

(Continued)

FOREIGN PATENT DOCUMENTS

KR 10-2011-0129102 A 12/2011
KR 10-2012-0089950 A 8/2012

(Continued)

*Primary Examiner* — Caleb E Henry
(74) *Attorney, Agent, or Firm* — Fenwick & West LLP

(57) ABSTRACT

The display device includes a substrate including a display area and a non-display area; a plurality of sub-pixels disposed on the substrate and in the display area; a light-emitting layer included in each of the plurality of sub-pixels; an encapsulation layer covering the light-emitting layer; a touch electrode and a buffer layer disposed on the encapsulation layer; and a color filter and a black matrix disposed on the buffer layer, wherein the black matrix includes a first layer, a second layer, and a third layer, wherein the color filter partially overlaps the first layer.

20 Claims, 5 Drawing Sheets

(56) References Cited

U.S. PATENT DOCUMENTS

| | | | | |
|---|---|---|---|---|
| 2016/0013260 | A1* | 1/2016 | Ahn | H10K 59/126<br>438/34 |
| 2016/0035795 | A1* | 2/2016 | Lim | H10K 59/38<br>257/40 |
| 2016/0365397 | A1* | 12/2016 | Seo | H10K 59/38 |
| 2017/0141166 | A1* | 5/2017 | Kim | H10K 71/00 |
| 2018/0254308 | A1* | 9/2018 | Choe | H10K 50/171 |
| 2018/0331326 | A1* | 11/2018 | Woo | H10K 59/124 |
| 2019/0013363 | A1* | 1/2019 | Joo | H10K 59/35 |
| 2019/0221767 | A1 | 7/2019 | Lee et al. | |
| 2020/0006694 | A1* | 1/2020 | Lim | H10K 59/352 |
| 2021/0013268 | A1* | 1/2021 | Joo | H10K 50/805 |
| 2021/0202630 | A1* | 7/2021 | Jeon | H10K 59/122 |
| 2021/0202676 | A1* | 7/2021 | Jeong | H10K 59/18 |
| 2021/0202686 | A1* | 7/2021 | Jeon | H10K 50/19 |
| 2021/0202896 | A1 | 7/2021 | Lee et al. | |
| 2021/0356636 | A1* | 11/2021 | Yu | H10K 59/8792 |
| 2022/0140283 | A1 | 5/2022 | Kim et al. | |
| 2022/0158139 | A1 | 5/2022 | Kim | |

FOREIGN PATENT DOCUMENTS

| | | | |
|---|---|---|---|
| KR | 10-2019-0088148 | A | 7/2019 |
| KR | 10-2019-0096472 | A | 8/2019 |
| KR | 10-2021-0085125 | A | 7/2021 |
| KR | 10-2022-0058720 | A | 5/2022 |
| KR | 10-2022-0067083 | A | 5/2022 |

* cited by examiner

ORGANIC LIGHT EMITTING DISPLAY DEVICE CAPABLE OF PREVENTING LIFT-OFF DEFECTS

CROSS-REFERENCE TO RELATED APPLICATION

This application claims priority from Republic of Korea Patent Application No. 10-2022-0139511 filed on Oct. 26, 2022 in the Korean Intellectual Property Office, which is hereby incorporated by reference in its entirety.

BACKGROUND

Field

The present disclosure relates to a display device.

Description of Related Art

Recent display devices capable of displaying various information and interacting with users who view the information are required to have various sizes, various shapes, and various functions.

These display devices include a liquid crystal display device (LCD), an electrophoretic display device (EPD), and an organic light-emitting display device (OLED).

The organic light-emitting display device is a self-luminous display device, and does not require a separate light source which is not the case for the LCD, and thus may be manufactured in a lightweight and thin form. Moreover, the organic light-emitting display device is not only advantageous in terms of power consumption due to low voltage operation, but also is excellent in terms of color rendering, response speed, viewing angle, and contrast ratio (CR), and thus is being studied as a next-generation display.

The organic light-emitting display device controls current flowing through an organic light-emitting diode using a plurality of thin-film transistors (TFTs) to display an image. A polarizer is provided to prevent reflection of external light and reduce internal light leakage in displaying an image.

Further, a portable terminal such as a wireless terminal, personal digital assistant (PDA), portable multimedia player (PMP), and an electronic notebook is increasingly smaller for portability. However, since a user wants to view various information such as text information, video, still image, MP3, and game on a screen of the portable terminal, a large and wide screen of a display device thereof is required. However, the miniaturization of the portable terminal requires a reduction in a size of the screen of the display device. Thus, there is a limit to satisfying both requirements.

In order overcome this limitation, a flexible display device such as a bendable display device or a foldable display device has recently been developed.

SUMMARY

An organic light-emitting display device equipped with a polarizer has a following problem. Due to the polarizer, luminance of the organic light-emitting display device is lowered, such that power consumption should increase to improve the luminance.

The organic light-emitting display device may include a color filter disposed on a substrate on which a thin-film transistor and a light-emitting element are disposed. Source and drain electrodes of the thin-film transistor are disposed on the substrate, and an anode electrode of the light-emitting element electrically connected to the drain electrode is disposed on the thin-film transistor.

A vertical level of an inner area of the anode electrode is high while a vertical level of an outer area of the anode electrode is low due to a surface step caused by the source and drain electrodes of the thin-film transistor.

Further, each anode electrode may be disposed in each sub-pixel and may have a polygonal shape in a plan view. The anode electrodes may be be arranged in a regular manner. The anode electrode may be tilted in a plan view.

For example, an anode electrode of each of a red sub-pixel and a blue sub-pixel has a hexagonal or octagonal structure. Each of anode electrodes of an N-th column of green sub-pixels may be tilted by 5 to 50° in a counterclockwise direction in a plan view, and each of anode electrodes of an (N+1)-th column of green sub-pixels may be tilted by 5 to 50° in a clockwise direction in a plan view.

When the display device does not operate, and external light is reflected from the anode electrode and then passes through a color filter disposed on top of the anode electrode and then is emitted to an outside. In this case, because structures of the anode electrodes of the sub-pixels are different from each other, directions in which the external light is reflected from the anode electrodes of the sub-pixels, respectively may be different from each other.

The reflected light passes through the color filter disposed on the anode electrode and the light-emitting layer and leaks out of the display device. In this regard, the directions in which the external light is reflected from the anode electrodes of the sub-pixels, respectively may be different from each other. Thus, the reflected light is refracted at different refraction angles, resulting in a rainbow mura defect in which a color of the light is separated into rainbow colors.

Further, when the height of the black matrix is smaller than that of the color filter, a step is formed due to the difference between the heights of the black matrix and the color filter.

Due to the step, adhesion between a planarization layer on the color filter and a side surface of the color filter becomes weak during folding and unfolding operations of the organic light-emitting display device, such that a lift-off defect between the planarization layer and the color filter may occur.

Accordingly, the inventors of the present disclosure may have invented a display device in which the rainbow mura defect due to light leakage inside the display device may be reduced, and top surfaces of the color filter and the black matrix are coplanar with each other such that the lift-off defect between the color filter and the planarization layer may be prevented.

A purpose according to an embodiment of the present disclosure is to provide a display device in which a polarizer is absent, and the rainbow mura defect due to a difference between reflections of external light from the anode electrodes of the sub-pixels may be reduced.

A purpose according to an embodiment of the present disclosure is to provide a display device in which the lift-off defect between and the color filter and the planarization layer disposed on the color filter may be prevented.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display device according to an embodiment of the present disclosure may be provided. The display device includes a substrate including a display area and a non-display area; a plurality of sub-pixels disposed on the substrate and in the display area; a light-emitting layer included in each of the plurality of sub-pixels; an encapsulation layer covering the light-emitting layer; a touch electrode and a buffer layer disposed on the encapsulation layer; and a color filter and a black matrix disposed on the buffer layer, wherein the black matrix includes a first layer, a second layer, and a third layer, wherein the color filter partially overlaps the first layer.

A display device according to another embodiment of the present disclosure may be provided. The display device includes a substrate including a display area and a non-display area; a plurality of sub-pixels and a plurality of transistors disposed on the substrate and in the display area; a light-emitting layer electrically connected to each of the plurality of transistors; an encapsulation layer covering the light-emitting layer; and a color filter and a black matrix disposed on the encapsulation layer, wherein the black matrix includes a first layer, a second layer, and a third layer, wherein the color filter is in contact with a side surface and a portion of an upper surface of the first layer.

Details of other embodiments are included in the detailed descriptions and drawings.

According to the embodiment of the present disclosure, using the structures of the color filter and the black matrix, the rainbow mura defect due to a difference between reflections of external light from the anode electrodes of the sub-pixels may be reduced, and the lift-off defect between the color filter and the planarization layer may be prevented.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

DETAILED DESCRIPTION

Figure 1:
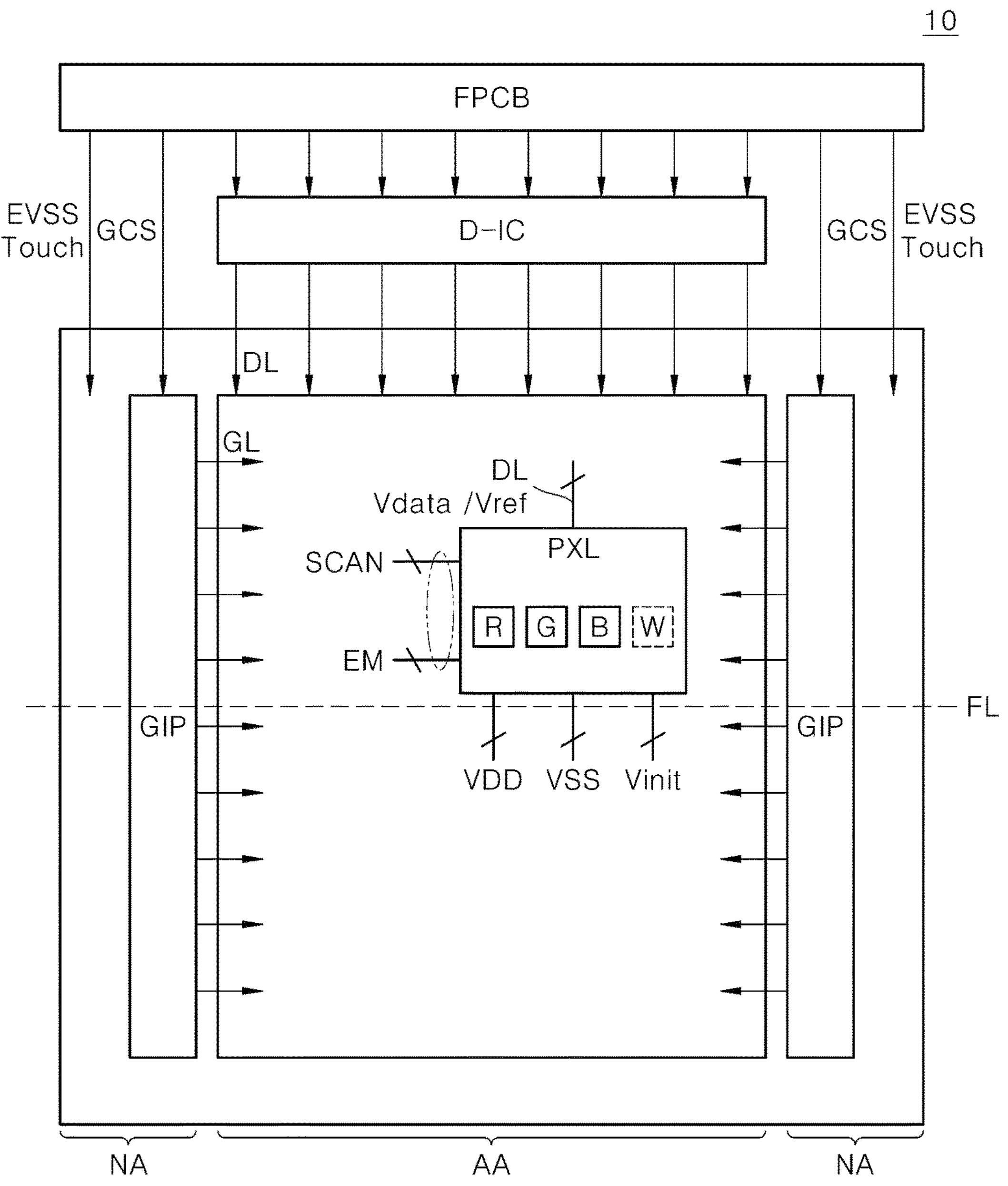
FIG. 1 is a block diagram of a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

In description of flow of a signal, for example, when a signal is delivered from a node A to a node B, this may include a case where the signal is transferred from the node A to the node B via another node unless a phrase 'immediately transferred' or 'directly transferred' is used.

As used herein, the term "display device" may include, in a narrow sense, a display device including a liquid crystal module (LCM), an organic light-emitting diode (OLED) module, or a quantum dot (QD) module including a display panel and a driver for driving the display panel. Moreover, the display device may include, in a broad sense, a set electronic device, a set device or a set apparatus including a complete product or a final product including the LCM, the OLED module, or the QD module such as a laptop computer, a television, a computer monitor, an automotive device, mobile electronic device such as a smartphone or a electronic pad.

Therefore, the display device in accordance with the present disclosure may include, in the narrow sense, a display device itself including, for example, the LCM, the OLED module, QD module, etc., and may include, in a broad sense, the set device as an application product or an end-user device including a complete product or a final product including the LCM, the OLED module, or the QD module.

Moreover, in some cases, the LCM, OLED module, or QD module composed of the display panel and the driver may be expressed as "display device" in a narrow sense. The electronic device as a complete product including the LCM, OLED module or QD module may be expressed as "set device" in a broad sense. For example, the display device in the narrow sense may include a display panel such as a liquid crystal panel, an organic light-emitting display panel, or a quantum dot display panel, and a source PCB as a controller for driving the display panel. The set device in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set device.

As used herein, the display panel may be of any type of the display panels such as a liquid crystal display panel, an organic light emitting diode (OLED) display panel, a quantum dot (QD) display panel, and an electroluminescent display panel, etc. Embodiments are not limited thereto. For example, the display panel may be embodied as a display panel which may be vibrated by a vibrating device according to an embodiment of the present disclosure to generate a sound. A display panel applied to a display device according to an embodiment of the present disclosure is not limited to a shape or a size of the display panel.

Hereinafter, various embodiments of the present disclosure will be described in detail with reference to drawings.

FIG. 1 is a block diagram illustrating a display device according to an embodiment of the present disclosure.

A display device 10 may include a plurality of areas. For example, the display device 10 may include one or more display areas AA where an image is displayed, and a pixel PXL array may be formed in the display area AA. One or more non-display areas NA in which an image is not displayed may include a driver circuit area and a dam area, and may be disposed on one side of the display area AA. For example, the non-display area NA may be adjacent to one or more sides of the display area AA.

Referring to FIG. 1, the non-display area NA may surround the display area AA of a rectangular shape. However, it should be understood that a shape of the display area AA and a position of the non-display area NA adjacent to the display area AA are not specifically limited to those in the display device 10 as shown in FIG. 1. Each of the display area AA and the non-display area NA may have any shape. Examples of these shapes may include a pentagon, a hexagon, a circle, an oval, etc. An embodiment of the present disclosure is not limited thereto.

The display device 10 may be flexibly folded or unfolded around a folding line FL in the display area AA. In an in-folding manner, the display device is folded around the folding line FL such that two display areas AA face each other. In an out-folding manner, the display device is folded around the folding line FL such that each of two display areas AA faces outwardly. When the number of the folding lines FL is at least two, the display area AA may be divided into at least three areas which may be folded or unfolded around the folding lines, respectively.

The pixel PXL in the display area AA includes sub-pixels. The sub-pixels may display colors such as red (R), green (G), blue (B), and white (W). Moreover, each of the sub-pixels may be associated with a pixel circuit including one or more transistor thin-film transistors (TFTs) which are disposed on a substrate of the display device 10. Each pixel circuit may be electrically connected to a gate line GL and a data line DL to communicate with one or more driver circuits, for example, a gate driver GIP and a data driver D-IC disposed in the non-display area NA of the display device 10.

One or more driver circuits may be implemented as TFTs disposed in the non-display area NA as shown in FIG. 1. For example, the gate driver GIP may be implemented using a plurality of TFTs on the substrate of the display device 10. Non-limiting examples of circuits that may be implemented as the TFTs of the substrate include an inverter circuit, a multiplexer, and an ESD (electro-static discharge) circuit. An embodiment of the present disclosure is not limited thereto.

Some driver circuits may be provided as integrated circuit (IC) chips, and may be mounted in the non-display area NA of the display device 10 using a chip-on-glass (COG) or in other similar schemes. Moreover, some driver circuits may be mounted on another substrate, and may be coupled to a connection interface (pads/bumps, pins) disposed in the non-display area NA using a printed circuit board such as a flexible printed circuit board (FPCB), chip-on-film (COF), tape-carrier-package (TCP) or other suitable schemes.

In embodiments of the present disclosure, at least two different types of TFTs are disposed in a TFT substrate for display. The types of TFTs employed in a portion of the pixel circuit and a portion of the driver circuit may vary according to requirements of display.

For example, the pixel circuit may be implemented as a TFT (e.g., oxide TFT) with an oxide active layer. The driver circuit may be implemented as a TFT (e.g., LTPS TFT) with a low-temperature polycrystalline silicon active layer and a TFT with an oxide active layer. Unlike the LTPS TFTs, the oxide TFTs do not suffer from pixel-to-pixel threshold voltage Vth variation. A uniform threshold voltage Vth may also be obtained in an array of pixel circuits for display. The uniformity problem of the threshold voltages Vth of the TFTs implementing the driver circuit will have less direct impact on the luminance uniformity of the pixels.

The driver circuits (for example, the gate driver) may have the gate driver IC embedded inside the display panel to reduce the number of driver ICs to achieve cost reduction, and may provide a high-speed scan si1gnal to the display area of the display panel.

Using the driver circuits on the substrate to be implemented as the LTPS TFTs, signals and data may be provided to pixels at a higher clock than that when all TFTs in the TFT panel are embodied as oxide TFTs. Therefore, the display device capable of high-speed operation may be realized without stains such as mura. For example, the advantages of the oxide TFT and the LTPS TFT are combined with the design of the TFT panel such that the oxide TFT and the LTPS TFT may be selectively used according to the advantage thereof.

Referring to FIG. 1, a low-potential voltage EVSS, a touch signal ToE, and a gate control signal GCS output from the flexible PCB (printed circuit board) (FPCB) are applied to the display panel, and a high-potential voltage is applied to the display panel via the data driver D-IC.

The gate driver GIP may be provided with a SCAN circuit connected to a switching transistor ST1 of the pixel PXL for transmitting a signal for turning on/off the switching transistor ST1 thereto, and an EM circuit connected to a light-emission signal line EM of the pixel PXL.

Figure 2:
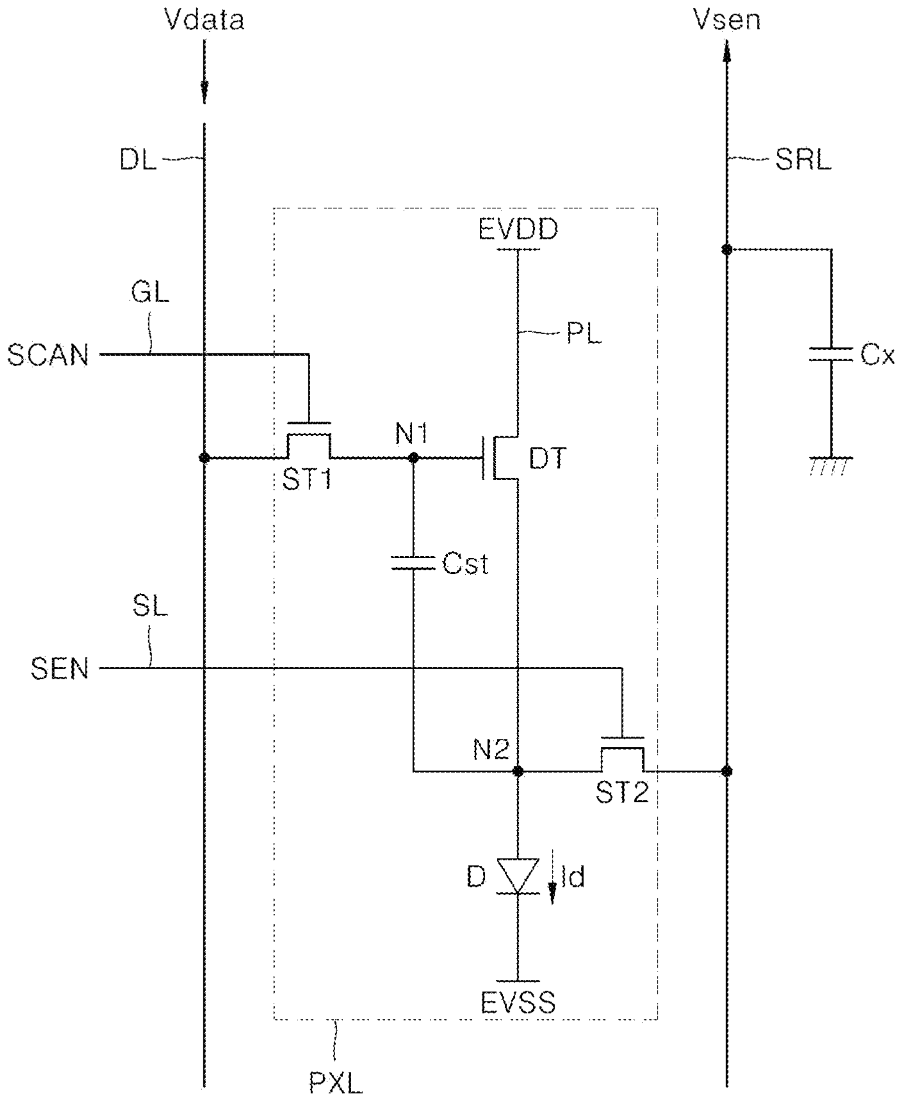
FIG. 2 is a block diagram of a sub-pixel of a display device according to an embodiment of the present disclosure.

FIG. 2 illustrates a sub-pixel circuit that may be used in embodiments of the present disclosure. FIG. 2 illustrates an example in which the display device has a 3T1C structure including three thin-film transistors and one storage capacitor. However, the display device of the present disclosure is not limited to this structure, and may have various structures such as 4T1C, 5T1C, 6T1C, 7T1C, 8T1C, 4T2C, 5T2C, 6T2C, 7T2C, and 8T2C.

Referring to FIG. 2, the display device 10 according to an embodiment of the present disclosure may include the gate line GL, the data line DL, a power line PL, and a sensing voltage read-out line SRL. Each sub-pixel SP may include a first switching thin-film transistor ST1, a second switching thin-film transistor ST2, a driving thin-film transistor DT, a light-emitting element D, and a storage capacitor Cst. However, embodiments of the present disclosure are not limited thereto.

The light-emitting element D includes an anode electrode connected to a second node N2, a cathode electrode connected to an input of the low-potential driving voltage EVSS, and a light-emitting element layer disposed between the anode electrode and the cathode electrode. The light-emitting element D may be an organic light-emitting element. However, embodiments of the present disclosure are not limited thereto.

The driving thin-film transistor DT may control current Id flowing through the light-emitting element D based on a voltage difference Vgs between a voltage of a gate and that of a source. The driving thin-film transistor DT may include a gate electrode connected to a first node N1, a drain electrode connected to the power line PL so as to provide a high-potential driving voltage EVDD thereto, and a source electrode connected to the second node N2.

The storage capacitor Cst is disposed between and connected to the first node N1 and the second node N2. The storage capacitor Cst allows a predefined voltage to be maintained for one frame.

The first switching thin-film transistor ST1 may apply a data voltage Vdata charged in the data line DL to the first node N1 in response to a gate signal SCAN so as to turn on the driving thin-film transistor DT during an operation of the display panel. In this regard, the first switching thin-film transistor ST1 may include a gate electrode connected to the gate line GL for receiving the gate signal SCAN therefrom, a drain electrode connected to the data line DL for receiving the data voltage Vdata therefrom, and a source electrode connected to the first node N1.

The second switching thin-film transistor ST2 switches a current between the second node N2 and a sensing voltage read-out line SRL in response to a sensing signal SEN such that a source voltage of the second node N2 is stored in a sensing capacitor Cx of the sensing voltage read-out line SRL. The second switching thin-film transistor ST2 switches a current between the second node N2 and the sensing voltage read-out line SRL in response to the sensing signal SEN during an operation of a display panel PAN such that the source voltage of the driving thin-film transistor DT is reset with an initialization voltage Vpre. A gate electrode of the second switching thin-film transistor ST2 is connected to the sensing line SL, a drain electrode thereof is connected to the second node N2, and a source electrode thereof is connected to the sensing voltage read-out line SRL.

Figure 3:
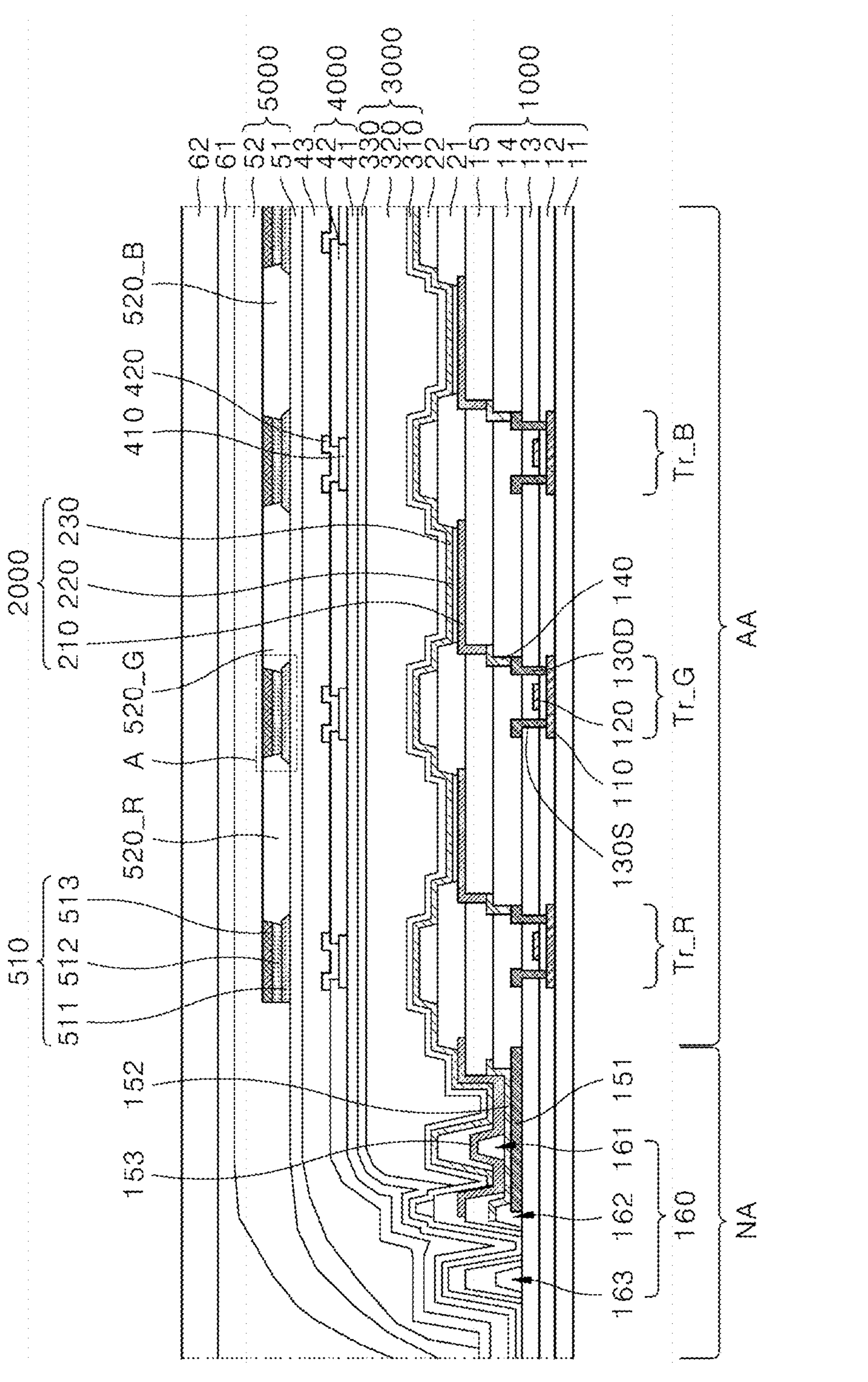
FIG. 3 is a cross-sectional view of a display device according to an embodiment of the present disclosure.

FIG. 3 is a cross-sectional view of a display device according to an embodiment of the present disclosure.

A substrate 11 of the display device according to an embodiment of the present disclosure may include a first substrate and a second substrate, and an intermediate layer between the first substrate and the second substrate.

The first substrate and the second substrate may be made of at least one of polyimide, polyethersulfone, polyethylene terephthalate, and polycarbonate. Embodiments of the present disclosure are not limited thereto. When the substrate is made of a plastic material, a manufacturing process of the display device may proceed in a state where a support substrate made of glass is disposed under the substrate. Then, after the manufacturing process of the display device is completed, the support substrate may be released. Further, after the support substrate is released, a back plate (or a plate) to support the substrate may be disposed under the substrate. When the substrate is made of a plastic material, moisture may invade into the substrate and then into the thin-film transistor or the light-emitting element layer, which may deteriorate the performance of the display device. The display device according to an embodiment of the present disclosure may be composed of the two substrates, that is, the first substrate and the second substrate made of a plastic material in order to prevent performance degradation of the display device due to the moisture permeation. Further, the intermediate layer made of an inorganic material may be disposed between the first substrate and the second substrate so as to prevent moisture from penetrating the substrate, thereby may improve the performance reliability of the product. The intermediate layer may be composed of an inorganic film. For example, the intermediate layer may be composed of a single layer of silicon nitride (SiNx) or silicon oxide (SiOx) or a stack of multiple layers made of thereof. However, the present disclosure is not limited thereto.

The display device formed on the substrate 11 may include a plurality of areas. In the present disclosure, the plurality of areas include a display area AA and a non-display area NA. However, embodiments of the present disclosure are not limited thereto.

On the substrate 11, a transistor portion 1000, a light-emitting portion 2000, an encapsulation 3000, a touch portion 4000, and a color filter portion 5000 are disposed. However, the present disclosure is not limited thereto.

A buffer layer composed of a single layer made of silicon nitride (SiNx) or silicon oxide (SiOx) or a stack of multiple layers made thereof may be disposed on one surface of the substrate 11 and in the display area AA and the non-display area NA. The buffer layer may improve adhesion between layers formed on the buffer layer and the substrate 11, and may perform a role of blocking various types of defect-causing factors, such as alkali components flowing out from the substrate 11. Further, the buffer layer may retard diffusion of moisture or oxygen that has penetrated into the substrate 11.

The buffer layer may be omitted based on a type and a material of the substrate, a structure and type a of the thin-film transistor, and the like.

Transistors constituting the transistor portion 1000 may be formed on the substrate 11 and the buffer layer and in the display area AA and the non-display area NA. The transistor in the display area AA may include a switching transistor or a driving transistor for driving the sub-pixel, while the transistor in the non-display area NA may include a light-emission transistor or a gate driver transistor or for driving the gate driver GIP.

In the display area AA according to FIG. 3, a red driving transistor Tr_R, a green driving transistor Tr_G, and a blue driving transistor Tr_B of red (R), green (G), and blue (B) sub-pixels, respectively, are disposed.

Each of the red driving transistor Tr_R, the green driving transistor Tr_G, and the blue driving transistor Tr_B may include a semiconductor layer 110, a gate electrode 120, a source electrode 130S, and a drain electrode 130D disposed on the substrate or the buffer layer. The semiconductor layer 110 may be made of LTPS (Low Temperature Polycrystalline Silicon) or a metal oxide semiconductor. For example, the metal oxide semiconductor may be made of one of IGZO (Indium-gallium-zinc-oxide), IZO (Indium-zinc-oxide), IGTO (Indium-gallium-tin-oxide), and IGO (Indium-gallium-oxide). However, the present disclosure is not limited thereto.

A channel area, and a source area or a drain area respectively connected to a source electrode or a drain electrode may be formed in the LPTS semiconductor layer via doping.

Conductivity of the metal oxide semiconductor may be improved via a doping process in which impurities are implanted into the metal oxide semiconductor. The metal oxide semiconductor may include a channel area in which a channel along which electrons or holes migrate is formed.

A gate insulating film 12 may be disposed on the semiconductor layer 110. Since the gate insulating film 12 is disposed between the semiconductor layer 110 and the gate electrode 120, the gate insulating film 12 may insulate the semiconductor layer 110 and the gate electrode 120 from each other.

The gate insulating film 12 may be made of an insulating inorganic material such as silicon nitride (SiNx) or silicon oxide (SiOx), or an insulating organic material. However, embodiments of the present disclosure are not limited thereto.

A gate electrode 120 may be disposed so as to overlap the semiconductor layer 110.

The gate electrode 120 may be composed of a single layer or a stack of multiple layers made of any one of silver (Ag), molybdenum (Mo), copper (Cu), titanium (Ti), aluminum (Al), chromium (Cr), nickel (Ni), neodymium (Nd), tungsten (W), and gold Au or an alloy thereof. However, the present disclosure is not limited thereto.

An interlayer insulating film 13 may be disposed on the gate electrode 120.

The interlayer insulating film 13 may be made of an insulating inorganic material such as silicon nitride (SiNx) or silicon oxide (SiOx), or may be made of an insulating organic material. However, embodiments of the present disclosure are not limited thereto.

A source electrode 130S and a drain electrode 130D connected to the semiconductor layer 110 may be disposed on the interlayer insulating film 13.

The source electrode 130S and the drain electrode 130D may be formed in the same process, and may be made of at least one of silver (Ag), molybdenum (Mo), copper (Cu), titanium (Ti), aluminum (Al), chromium (Cr), nickel (Ni), neodymium (Nd), tungsten (W), and gold (Au). Alternatively, each of the source electrode 130S and the drain electrode 130D may be composed of at least two or more layers including a first layer made of titanium (Ti), and a second layer made of at least one of molybdenum (Mo), copper (Cu), aluminum (Al), silver (Ag), chromium (Cr), gold (Au), neodymium (Nd), and nickel (Ni). However, the present disclosure is not limited thereto.

A first line 151 may be formed in the non-display area NA using the same process as a process of forming the source electrode 130S and the drain electrode 130D.

The first line 151 may transfer the low-potential voltage EVSS output from the flexible PCB (printed circuit board) (FPCB) to a cathode electrode 230.

A first planarization layer 14 may be disposed on the source electrode 130S and the drain electrode 130D, and a portion of the first line 151.

The first planarization layer 14 may be composed of an inorganic insulating film made of, for example, silicon nitride (SiNx) or silicon oxide (SiOx), or an organic insulating film made of, for example, polyacrylate or polyimide. Embodiments of the present disclosure are not limited thereto.

A connection electrode 140 is disposed on the first planarization layer 14 so as to electrically connect the drain electrode 130D and an anode electrode 210 to each other via a contact-hole formed in the first planarization layer 14.

The connection electrode 140 may be made of at least one of silver (Ag), molybdenum (Mo), copper (Cu), titanium (Ti), aluminum (Al), chromium (Cr), nickel (Ni), neodymium (Nd), tungsten (W), and gold (Au). Alternatively, the connection electrode 140 may be composed of at least two or more layers including a first layer made of titanium (Ti), and a second layer made of at least one of molybdenum (Mo), copper (Cu), aluminum (Al), silver (Ag), chromium (Cr), gold (Au), neodymium (Nd), and nickel (Ni). However, the present disclosure is not limited thereto.

A second line 152 may be formed and disposed in the non-display area NA in the same process as a process of forming the connection electrode 140. The second line 152 may be connected to the first line 151 and thus may be used as an auxiliary electrode for transmitting a voltage to the cathode electrode 230.

A second planarization layer 15 may be disposed on the connection electrode 140 and a portion of the second line 152.

The second planarization layer 15 may be composed of an organic insulating film made of, for example, polyacrylic polyacrylate or polyimide, and may reduce a step caused by the lines and contact-holes formed thereunder. However, embodiments of the present disclosure are not limited thereto.

The anode electrode 210, a light-emitting element layer 220, and the cathode electrode 230 constituting the light-emitting portion 2000 may be disposed on the second planarization layer 15 and in the display area AA.

The anode electrode 210 may be electrically connected to the drain electrode 130D of the driving transistor DR Tr via the connection electrode 140.

The anode electrode 210 may be made of at least one or more of silver (Ag), aluminum (Al), gold (Au), molybdenum (Mo), tungsten (W), chromium (Cr), lead (Pd), an alloy thereof, indium tin oxide (ITO), indium zinc oxide (IZO). However, embodiments of the present disclosure are not limited thereto.

A third line 153 may be disposed in the non-display area NA and may be formed in the same process as a process of forming the anode electrode 210.

The third line 153 may be connected to the second line 152 and the first line 151 and thus may be used as an auxiliary electrode for transmitting a voltage to the cathode electrode 230. Depending on a design, the second line 152 or the third line 153 may be omitted.

A bank 21 may be disposed on a portion of the anode electrode 210 and a portion of the third line 153.

The bank 21 may distinguish a plurality of sub-pixels from each other, minimize light blurring, and prevent color mixing occurring at various viewing angles.

The bank 21 may not cover a portion of the anode electrode 210 corresponding to a light-emissive area so as to be exposed, and may overlap a side end area of the anode electrode 210.

Further, the bank 21 may overlap a hole formed in the interlayer insulating film 13, a hole formed in the first planarization layer 14, and a contact-hole formed in the second planarization layer 15.

The bank 21 may be made of an inorganic insulating material such as silicon nitride (SiNx) or silicon oxide (SiOx), or may be made of at least one organic insulating material among BCB (BenzoCycloButene), acryl resin, epoxy resin, phenolic resin, polyamide resin, and polyimide resin. Alternatively, the bank 21 may be embodied as a black bank in which a black pigment is added to the above material to reduce light reflection. However, the present disclosure is not limited thereto.

A spacer 22 may be further disposed on the bank 21. The spacer 22 protrudes from the bank 21. The spacer 22 may support a fine metal mask (FMM) and the fine metal mask in depositing the organic light-emitting layer in the light-emitting area to prevent the bank 21 from being damaged by the fine metal mask. The spacer 22 may serve to prevent or at least reduce the organic light-emitting layer from being damaged by an external physical force during a subsequent manufacturing process or during use of the display device.

The spacer 220 may be made of the same material as that of the bank 21, and the spacer 220 and the bank 21 may be formed simultaneously. However, the present disclosure is not limited thereto.

The light-emitting element layer 220 may be disposed in an opening of the bank 21 exposing the portion of the anode electrode 210. The light-emitting element layer 220 may include at least one organic light-emitting layer selected from a red light-emitting layer, a green light-emitting layer, a blue light-emitting layer, and a white light-emitting layer in order to emit light of a specific color.

When the light-emitting element layer 220 includes the white organic light-emitting layer, the light-emitting element layer 220 may be disposed in the opening of the bank 21 and over an entire surface of the substrate.

The light-emitting element layer 220 may include the organic light-emitting layer as well as a hole injection layer, a hole transport layer, an electron transport layer, and an electron injection layer. However, the present disclosure is not limited thereto.

The cathode electrode 230 may be disposed on the light-emitting element layer 220. The cathode electrode 230 supplies electrons to the light-emitting element layer 220 and may be made of a conductive material having a low work function.

When the display device 10 is of a top emission type, the cathode electrode 230 may be made of a transparent conductive material through which light transmits. For example, the transparent conductive material may include indium tin oxide (ITO), and indium zinc oxide (IZO). However, the present disclosure is not limited thereto.

Alternatively, the cathode electrode 2300 may be made of a semi-transmissive conductive material that transmits light therethrough. For example, the cathode electrode 230 may be made of at least one or more of LiF/Al, CsF/Al, Mg:Ag, Ca/Ag, Ca:Ag, LiF/Mg:Ag, LiF/Ca/Ag, and LiF/Ca:Ag. However, the present disclosure is not limited thereto.

When the display device 10 is of a bottom emission type, the cathode electrode 230 may act as a reflective electrode that reflects light therefrom and may be made of an opaque conductive material. For example, the cathode electrode 230 may be made of at least one of silver (Ag), aluminum (Al), gold (Au), molybdenum (Mo), tungsten (W), chromium (Cr), or an alloy thereof.

In the non-display area NA of the display device 10, a driver circuit area and a dam area 160 in which a plurality of dams are disposed are disposed. The non-display area NA may be an area where the display device 10 is sealed using a connection portion where the cathode electrode 620 and the EVSS line are electrically connected to each other, an encapsulation layer, and the plurality of dams.

The gate insulating film 12, the interlayer insulating film 13, the first planarization layer 14 and the second planarization layer 15 disposed on the substrate 11 may extend into the non-display area NA.

Lines may be disposed in the non-display area NA so that the power voltage and the touch signal applied from the FPCB of the display device 10 are applied to the display panel via the lines.

The plurality of dams may be disposed in the dam area 160 of the non-display area NA. In order to prevent leakage of a second encapsulation layer 320 made of the organic material, each of the plurality of dams may have a stack structure in which at least one insulating layer may be stacked. However, embodiments of the present disclosure are not limited thereto.

The plurality of dams may include a first dam 161, a second dam 162, and a third dam 163 which may have a first height, a second height, and a third height, respectively, and may surround the display area AA.

The second height may be larger than the first height, and the third height may be smaller than the second height.

Even when the second encapsulation layer 320 flows over the first dam 161, the second dam 162 may block the second encapsulation layer 320.

Each of the first dam 161, the second dam 162, and the third dam 163 may be composed of a portion of the first planarization layer 14, a portion of the second planarization layer 15, a portion of the bank 21, and/or a portion of the spacer 22.

The first line 151 may be disposed under the portion of the second planarization layer 15 constituting the first dam 161 and the portion of the first planarization layer 14 constituting the second dam 162.

The second line 152 may be disposed under the portion of the second planarization layer 15 constituting the first dam 161, and between the portion of the first planarization layer 14 and the portion of the second planarization layer 15 constituting the second dam 162.

The third line 153 may be disposed between the portion of the second planarization layer 15 and the portion of the bank 21 constituting the first dam 161 and the second dam 162.

The first line 151, the second line 152, and the third line 153 may contact and be electrically connected to each other in an area in which the first dam 161 and the second dam 162 are disposed and thus may transmit a voltage to the cathode electrode 230.

The first line 151, the second line 152, and the third line 153 may be disposed so as to overlap a portion of the gate driver GIP in the driver circuit area.

A capping layer may be disposed on the cathode electrode 230. The capping layer is composed of an organic or inorganic film that protects the cathode electrode 230 and improves external light efficiency. Alternatively, the capping layer may be composed of an inorganic film and may be made of a metal material such as LiF, and the capping layer may further include an organic film. However, embodiments of the present disclosure are not limited thereto.

The encapsulation 3000 may be disposed on the cathode electrode 230 and the capping layer. The encapsulation 3000 may protect the display device 10 from external moisture, oxygen, or foreign matter. For example, the encapsulation 3000 may prevent penetration of oxygen and moisture from the outside into a light-emitting material and an electrode material in order to prevent oxidation of the light-emitting material and the electrode material.

The encapsulation 3000 may be made of a transparent material so that light emitted from the light-emitting element layer 220 transmits therethrough.

The encapsulation 3000 may include a first encapsulation layer 310, the second encapsulation layer 320, and a third encapsulation layer 330 so as to prevent penetration of moisture or oxygen into the light-emitting material and the electrode material. However, embodiments of the present disclosure are not limited thereto.

The first encapsulation layer 310, the second encapsulation layer 320, and the third encapsulation layer 330 may be sequentially stacked. However, embodiments of the present disclosure are not limited thereto.

Each of the first encapsulation layer 310 and the third encapsulation layer 330 may be made of at least one inorganic material selected from among silicon nitride (SiNx), silicon oxide (SiOx), and aluminum oxide (AlyOz). However, the present disclosure is not limited thereto.

The second encapsulation layer 320 may cover foreign substances or particles that may occur in the manufacturing process. Further, the second encapsulation layer 320 may planarize a surface of the first encapsulation layer 310.

The second encapsulation layer 320 may be made of an organic material, for example, silicon oxycarbon (SiOC), epoxy, polyimide, polyethylene, or acrylate-based polymer. However, the present disclosure is not limited thereto.

The touch portion 4000 for a touch operation of the display device 10 may be disposed on the third encapsulation layer 330.

The touch portion 4000 may include a touch buffer layer 41 which may be disposed on the third encapsulation layer 330. The touch buffer layer 41 may improve adhesion between layers formed on the touch buffer layer 41 and the third encapsulation layer 330.

The touch buffer layer 41 may be composed of a single layer of silicon nitride (SiNx) or silicon oxide (SiOx) or a stack of multiple layers made thereof. However, the present disclosure is not limited thereto.

The touch buffer layer 41 may extend into an area where a connection portion between the flexible PCB (FPCB) disposed in the non-display area NA and the substrate 11 is disposed.

A touch bridge electrode 410 may be disposed on the touch buffer layer 41. The touch bridge electrode 410 may electrically connect touch electrodes 420 to each other and may transmit a touch signal.

The touch bridge electrode 410 may be composed of a single layer or a stack of multiple layers made of one of silver (Ag), molybdenum (Mo), copper (Cu), titanium (Ti), aluminum (Al), chromium (Cr), nickel (Ni), neodymium (Nd), tungsten (W), and gold (Au) or an alloy thereof. However, the present disclosure is not limited thereto.

A touch insulating layer 42 may be disposed on the touch bridge electrode 410.

The touch insulating layer 42 may include a single layer made of silicon nitride (SiNx) or silicon oxide (SiOx) or a stack of multiple layers made thereof. However, the present disclosure is not limited thereto.

The touch electrode 420 may be disposed on the touch insulating layer 42. The touch electrode 420 may by connected to a plurality of touch lines disposed in the non-display area NA so as be connected to a touch circuit in the flexible PCB (FPCB). Each of the touch electrodes 420 spaced from each other may be connected to the touch bridge electrode 410 via a contact-hole formed in the touch insulating layer 42.

The touch circuit supplies a touch driving signal to the touch electrode 420 to drive a touch operation, detects a touch sensing signal from the touch electrode 420, and senses whether a touch occurs and/or a touch location coordinate based on the detected touch sensing signal.

The touch electrode 420 may be composed of a single layer or a stack of multiple layers made of one of silver (Ag), molybdenum (Mo), copper (Cu), titanium (Ti), aluminum (Al), chromium (Cr), nickel (Ni), neodymium (Nd), tungsten (W), and gold (Au) or alloys thereof. However, the present disclosure is not limited thereto.

The touch electrode 420 and the touch bridge electrode 410 may be disposed at a position corresponding to a position of the bank 21 and the spacer 22.

A touch planarization layer 43 and a color buffer layer 51 may be formed on the touch electrode 420.

The touch planarization layer 43 and the color buffer layer 51 may extend into an area where the connection portion between the flexible PCB (FPCB) disposed in the non-display area NA and the substrate 11 is disposed.

Each of the touch planarization layer 43 and the color buffer layer 51 may be made of an inorganic insulating material such as silicon nitride (SiNx) or silicon oxide (SiOx), or at least one organic insulating material selected from BCB (benzocyclobutene), acryl resin, epoxy resin, phenolic resin, polyamide resin, and polyamide resin. However, the present disclosure is not limited thereto.

Color filters 520_R, 520_G, and 520_B and black matrixes 510 corresponding to the sub-pixels, respectively may be disposed on the color buffer layer 51.

The color filters 520_R, 520_G, and 520_B and the black matrixes 510 may be disposed in a corresponding manner to the sub-pixels, respectively.

The black matrix 510 may include a first black matrix 511, a second black matrix 512, and a third black matrix 513.

The black matrix 510 may be disposed in a position corresponding to a position of the bank 21.

A width of the bank 21 may be different from that of the black matrix 510. The width of the bank 21 may be greater than the width of the black matrix 510.

The width of the black matrix 510 may be less than that of the bank 21 to secure the maximum viewing angle of the light emitted from the light-emitting element layer 220 disposed in the opening of the bank 21.

In order to secure a viewing angle of 60° of the light emitted from the light-emitting element layer 220, a distance between a side end of the bank 21 and a side end of the black matrix 510 may be in a range of 8 μm to 8.5 μm for example.

The black matrix 510 may be disposed at a position corresponding to that of the touch electrode 420.

A width of the touch electrode 420 may be different from that of the black matrix 510. The width of the touch electrode 420 may be less than the width of the black matrix 510 so that the touch electrode 420 is not visible to a view out of the display device 10.

Figure 4A:
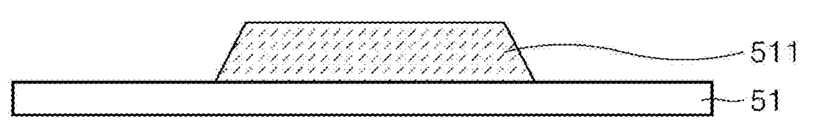
FIGS. 4A to 4C are cross-sectional views for illustrating a method for manufacturing a display device according to an embodiment of the present disclosure.
Figure 4B:
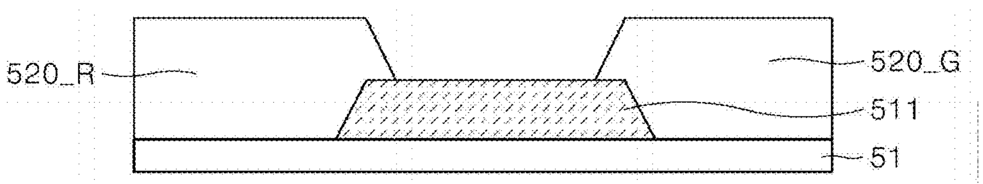
Figure 4C:
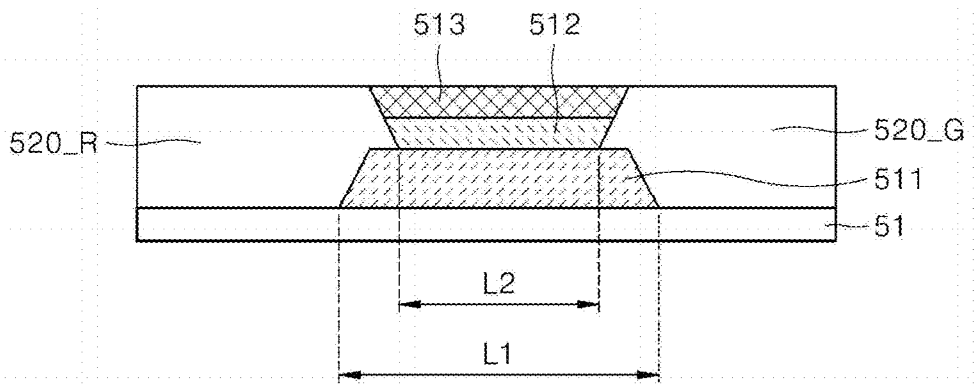

FIG. 4A and FIG. 4C schematically show an embodiment of forming the black matrix 510 according to the present disclosure.

Referring to FIG. 4A, the first black matrix 511 may be formed by depositing or coating a first black matrix material on the color buffer layer 51 and then patterning the deposited first black matrix material.

The first black matrix 511 may contain at least one of carbon black, aniline black, lactam black, and perylene black at a content range of 25% to 40% by weight based on a total weight of the first black matrix 511 according to one embodiment. However, embodiments of the present disclosure are not limited thereto.

The first black matrix 511 may define each sub-pixel and may block light.

Referring to FIG. 4B, each of the color filters 520_R, 520_G, and 520_B may be disposed on a side surface of the first black matrix 510. Each of the color filters 520_R, 520_G, and 520_B may be disposed in openings defined in the first black matrix 510.

The red color filter 520_R, the green color filter 520_G, and the blue color filter 520_B may be spaced apart from each other. Each of the red color filter 520_R, the green color filter 520_G, and the blue color filter 520_B may overlap a portion of the first black matrix 511. Each of the red color filter 520_R, the green color filter 520_G, and the blue color filter 520_B may cover a portion of an upper surface of the first black matrix 511.

Each of the red color filter 520_R, the green color filter 520_G, and the blue color filter 520_B may be formed by depositing or coating an organic material including each of red, green, and blue light-emitting materials and then patterning the deposited organic material.

Referring to FIG. 4C, the second black matrix 512 may be disposed on the first black matrix 511 and in a space between adjacent ones of the red color filter 520_R, the green color filter 520_G, and the blue color filter 520_B. Accordingly, A width L1 of a lower surface of the first black matrix 511 may be greater than a width L2 of a lower surface of the second black matrix 512.

The second black matrix 512 may be formed by depositing or coating a second black matrix material and then patterning the deposited second black matrix material.

The second black matrix 512 may contain at least one of carbon black, aniline black, lactam black, perylene black, or titanium dioxide ($TiO_2$) at a content range of 1% to 5% by weight based on a total weight of the second black matrix 512 according to one embodiment. The second black matrix 512 may include titanium dioxide ($TiO_2$) and at least one of carbon black, aniline black, lactam black, or perylene black.

A transmittance of visible light of the second black matrix 512 may controlled based on a content of the black material so as to have a low reflection function.

The third black matrix 513 may be formed by depositing or coating a third black matrix material on the second black matrix 512 and then patterning the deposited third black matrix material.

The third black matrix 513 may contain at least one of carbon nanotubes, carbon nanorods, or silica nanotubes at a content range of 1% to 5% by weight based on a total weight of the third black matrix 513 according to one embodiment.

The third black matrix 513 may diffract light at the nanoparticles, thereby preventing reflection of external light and reducing internal light leakage.

Figure 5:
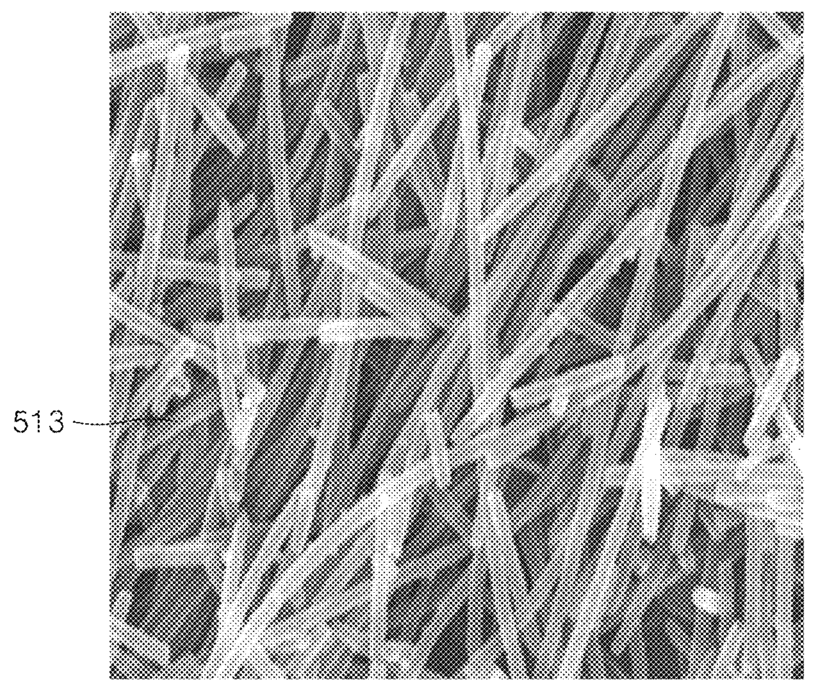
FIG. 5 is an enlarged picture of a surface of a black matrix according to an embodiment of the present disclosure.

Referring to FIG. 5, FIG. 5 is an enlarged image of the third black matrix 513. The nanoparticles in a tube form may be contained in the third black matrix 513 to diffract incident light thereon.

Referring to FIG. 4C, each of the second black matrix 512 and the third black matrix 513 may be disposed between adjacent ones of the color filters 520_R, 520_G, and 520_B. A side surface of each of the second black matrix 512 and the third black matrix 513 may come into contact with a side surface of each of the color filters 520_R, 520_G, and 520_B.

The first black matrix 511, the second black matrix 512, and the third black matrix 513 may be sequentially stacked.

Based on the upper surface of the color buffer layer 51, a vertical level of an upper surface of the black matrix 510, that is, a vertical level of an upper surface of the third black matrix 513 may be equal to a vertical level of an upper surface of each of the color filters 520_R, 520_G, and 520_B. A thickness of the black matrix 510 and a thickness of each of the color filters 520_R, 520_G, and 520_B may be equal to each other.

If the vertical level of the upper surface of each of the color filters 520_R, 520_G, 520_B and the vertical level of the upper surface of the black matrix 510 on the color buffer layer 51 are different from each other such that a step occurs between the upper surface of each of the color filters 520_R, 520_G, 520_B and the upper surface of the black matrix 510, that is, when the vertical level of the upper surface of each of the color filters 520_R, 520_G, and 520_B is higher than the vertical level of the upper surface of the black matrix 510, the side surface of each of the color filters 520_R, 520_G, and 520_B may come into contact with a color planarization layer 52.

When the folding or unfolding operation of the display device 10 is repeated, a lift-off defect may occur in an area in which the side surface of each of the color filters 520_R, 520_G, and 520_B is in contact with the color planarization layer 52.

However, in an embodiment of the present disclosure, each of the color filters 520_R, 520_G, and 520_B and the black matrix 510 have the same height, such that the upper surface of the black matrix 510 and the upper surfaces of the color filters 520_R, 520_G, and 520_B constitute a flat surface. Thus, when the folding or unfolding operation of the display device 10 is repeated, the lift-off defect between each of the color filters 520_R, 520_G, and 520_B and the color planarization layer 52 may be prevented.

Referring back to FIG. 3, the color planarization layer 52 may be disposed on the color filter 520 and the black matrix 510.

The color planarization layer 52 may be composed of an insulating inorganic insulating film made of, for example, silicon nitride (SiNx) or silicon oxide (SiOx), or may be composed of an organic insulating film made of, for example, polyacrylate or polyimide. However, embodiments of the present disclosure are not limited thereto.

The color planarization layer 52 may extend so as to be disposed in the non-display area NA.

An adhesive layer 61 for attaching a cover window 62 to the color planarization layer 52 may be disposed on the color planarization layer 52.

The adhesive layer 61 may be embodied as a gray adhesive layer having visible light transmittance in a range of 72% to 79% to reduce reflectance according to one embodiment.

A display device according to an embodiment of the present disclosure may be described as follows.

A first aspect of the present disclosure provides a display device comprising: a substrate including a display area and a non-display area; a plurality of sub-pixels disposed on the substrate and in the display area; a light-emitting layer included in each of the plurality of sub-pixels; an encapsulation layer covering the light-emitting layer; a touch electrode and a buffer layer disposed on the encapsulation layer; and a color filter and a black matrix disposed on the buffer layer, wherein the black matrix includes a first layer, a second layer, and a third layer, wherein the color filter partially overlaps the first layer.

In some implementations of the first embodiment of the present disclosure, a vertical level of an upper surface of the black matrix and a vertical level of an upper surface of the color filter based on an upper surface of the buffer layer are equal to each other.

In some implementations of the first embodiment of the present disclosure, the first layer contains at least one of carbon black, aniline black, lactam black, or perylene black at a content range of 25% to 40% by weight based on a total weight of the first layer.

In some implementations of the first embodiment of the present disclosure, the second layer contains at least one of carbon black, aniline black, lactam black, perylene black, or titanium dioxide ($TiO_2$) at a content range of 1% to 5% by weight based on a total weight of the second layer.

In some implementations of the first embodiment of the present disclosure, the third layer contains at least one of carbon nanotubes, carbon nanorods, or silica nanotubes at a content range of 1% to 5% by weight based on a total weight of the third layer.

In some implementations of the first embodiment of the present disclosure, the first layer, the second layer, and the third layer are vertically sequentially stacked.

In some implementations of the first embodiment of the present disclosure, a width of a lower surface of the first layer is larger than a width of a lower surface of the second layer.

In some implementations of the first embodiment of the present disclosure, each of the plurality of sub-pixels includes a transistor, wherein the display device further comprises: an anode electrode connected to the transistor; and a bank having an opening defined therein exposing the anode electrode.

In some implementations of the first embodiment of the present disclosure, the black matrix vertically overlaps the bank.

In some implementations of the first embodiment of the present disclosure, the non-display area includes a driver circuit area and a dam area.

In some implementations of the first embodiment of the present disclosure, the display device further comprises a planarization layer, an adhesive layer, and a cover window disposed on the color filter and the black matrix.

In some implementations of the first embodiment of the present disclosure, the adhesive layer has a visible light transmittance in a range of 72% to 79%.

A second embodiment of the present disclosure provides a display device comprising: a substrate including a display area and a non-display area; a plurality of sub-pixels and a plurality of transistors disposed on the substrate and in the display area; a light-emitting layer electrically connected to each of the plurality of transistors; an encapsulation layer covering the light-emitting layer; and a color filter and a black matrix disposed on the encapsulation layer, wherein the black matrix includes a first layer, a second layer, and a third layer, wherein the color filter is in contact with a side surface and a portion of an upper surface of the first layer.

In some implementations of the second embodiment of the present disclosure, a thickness of the black matrix and a thickness of the color filter are equal to each other.

In some implementations of the second embodiment of the present disclosure, the first layer contains at least one of carbon black, aniline black, lactam black, or perylene black at a content range of 25% to 40% by weight based on a total weight of the first layer.

In some implementations of the second embodiment of the present disclosure, the second layer contains at least one of carbon black, aniline black, lactam black, perylene black, or titanium dioxide ($TiO_2$) at a content range of 1% to 5% by weight based on a total weight of the second layer.

In some implementations of the second embodiment of the present disclosure, the third layer contains at least one of carbon nanotubes, carbon nanorods, or silica nanotubes at a content range of 1% to 5% by weight based on a total weight of the third layer.

In some implementations of the second embodiment of the present disclosure, the first layer, the second layer, and the third layer are vertically sequentially stacked.

In some implementations of the second embodiment of the present disclosure, a width of a lower surface of the first layer is larger than a width of a lower surface of the second layer.

In some implementations of the second embodiment of the present disclosure, a side surface of each of the second layer and the third layer is in contact with a side surface of the color filter.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display device comprising:

a substrate including a display area and a non-display area;

a plurality of sub-pixels on the display area of the substrate;

a light-emitting layer included in each of the plurality of sub-pixels;

an encapsulation layer covering the light-emitting layer;

a touch electrode and a buffer layer on the encapsulation layer; and a color filter and a black matrix on the buffer layer, wherein the black matrix includes a first layer, a second layer, and a third layer sequentially stacked vertically, and wherein a side surface of the color filter is in contact with each of a side surface of the first layer, a portion of an upper surface of the first layer extending from the side surface of the first layer, a side surface of the second layer, and a side surface of the third layer.

2. The display device of claim 1, wherein a vertical level of an upper surface of the black matrix and a vertical level of an upper surface of the color filter based on an upper surface of the buffer layer are equal to each other.

3. The display device of claim 1, wherein the first layer contains at least one of carbon black, aniline black, lactam black, or perylene black at a content range of 25% to 40% by weight based on a total weight of the first layer.

4. The display device of claim 1, wherein the second layer contains at least one of carbon black, aniline black, lactam black, perylene black, or titanium dioxide at a content range of 1% to 5% by weight based on a total weight of the second layer.

5. The display device of claim 1, wherein the third layer contains at least one of carbon nanotubes, carbon nanorods, or silica nanotubes at a content range of 1% to 5% by weight based on a total weight of the third layer.

6. The display device of claim 1, wherein a width of a lower surface of the first layer is greater than a width of a lower surface of the second layer.

7. The display device of claim 1, wherein each of the plurality of sub-pixels includes a transistor, and the display device further comprises:

an anode electrode connected to the transistor; and a bank having an opening that exposes the anode electrode.

8. The display device of claim 7, wherein the black matrix vertically overlaps the bank.

9. The display device of claim 1, wherein the non-display area includes a driver circuit area and a dam area.

10. The display device of claim 1, wherein the display device further comprises:

a planarization layer, an adhesive layer, and a cover window on the color filter and the black matrix.

11. The display device of claim 10, wherein the adhesive layer has a visible light transmittance in a range of 72% to 79%.

12. A display device comprising:

a substrate including a display area and a non-display area;

a plurality of sub-pixels and a plurality of transistors on the display area of the substrate;

a light-emitting layer electrically connected to each of the plurality of transistors;

an encapsulation layer covering the light-emitting layer; and a color filter and a black matrix on the encapsulation layer, wherein the black matrix includes a first layer, a second layer, and a third layer, and the color filter is in contact with a side surface and a portion of an upper surface of the first layer, and wherein a thickness of the black matrix and a thickness of the color filter are equal to each other.

13. The display device of claim 12, wherein the first layer contains at least one of carbon black, aniline black, lactam black, or perylene black at a content range of 25% to 40% by weight based on a total weight of the first layer.

14. The display device of claim 12, wherein the second layer contains at least one of carbon black, aniline black, lactam black, perylene black, or titanium dioxide at a content range of 1% to 5% by weight based on a total weight of the second layer.

15. The display device of claim 12, wherein the third layer contains at least one of carbon nanotubes, carbon nanorods, or silica nanotubes at a content range of 1% to 5% by weight based on a total weight of the third layer.

16. The display device of claim 12, wherein the first layer, the second layer, and the third layer are vertically sequentially stacked.

17. The display device of claim 12, wherein a width of a lower surface of the first layer is greater than a width of a lower surface of the second layer.

18. The display device of claim 12, wherein a side surface of each of the second layer and the third layer is in contact with a side surface of the color filter.

19. A display device comprising:

a substrate including a display area and a non-display area;

a plurality of sub-pixels on the display area of the substrate;

a light-emitting layer included in each of the plurality of sub-pixels;

an encapsulation layer covering the light-emitting layer;

a touch electrode and a buffer layer on the encapsulation layer; and a color filter and a black matrix on the buffer layer, wherein the black matrix includes a first layer, a second layer, and a third layer sequentially stacked vertically, and wherein a width of a lower surface of the first layer is greater than a width of a lower surface of the second layer.

20. A display device comprising:

a substrate including a display area and a non-display area;

a plurality of sub-pixels and a plurality of transistors on the display area of the substrate;

a light-emitting layer electrically connected to each of the plurality of transistors;

an encapsulation layer covering the light-emitting layer; and a color filter and a black matrix on the encapsulation layer, wherein the black matrix includes a first layer, a second layer, and a third layer, and the color filter is in contact with a side surface and a portion of an upper surface of the first layer, and wherein a width of a lower surface of the first layer is greater than a width of a lower surface of the second layer.

* * * * *